United States Patent
Liu et al.

(10) Patent No.: US 8,426,259 B2
(45) Date of Patent: Apr. 23, 2013

(54) ARRAY SUBSTRATE AND METHOD FOR MANUFACTURING THE SAME

(75) Inventors: Xiang Liu, Beijing (CN); Seongyeol Yoo, Beijing (CN); Jianshe Xue, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 74 days.

(21) Appl. No.: 13/150,389

(22) Filed: Jun. 1, 2011

(65) Prior Publication Data

US 2011/0297929 A1 Dec. 8, 2011

(30) Foreign Application Priority Data

Jun. 3, 2010 (CN) .......................... 2010 1 0197076

(51) Int. Cl.
  *H01L 21/336* (2006.01)
  *H01L 29/06* (2006.01)

(52) U.S. Cl.
  USPC ............. 438/158; 438/34; 438/149; 438/151; 349/43; 349/106; 349/114; 257/43; 257/59; 257/72; 257/E29.101; 257/E33.012; 257/E33.037; 257/E33.062; 257/E33.064

(58) Field of Classification Search .............. 438/34, 438/149, 151, 158; 349/43, 106, 114; 257/43, 257/59, 72, E29.101, E33.012, E33.037, 257/E33.062, E33.064

See application file for complete search history.

(56) References Cited

U.S. PATENT DOCUMENTS

| 2005/0263769 | A1 | 12/2005 | Chul Ahn | |
| 2007/0090366 | A1 | 4/2007 | Hung et al. | |
| 2008/0001154 | A1* | 1/2008 | Lee | ................................. 257/59 |
| 2010/0044711 | A1 | 2/2010 | Imai | |
| 2010/0159652 | A1* | 6/2010 | Kim et al. | ...................... 438/158 |
| 2011/0068341 | A1* | 3/2011 | Li et al. | ............................ 257/59 |
| 2012/0162585 | A1* | 6/2012 | Liu et al. | ....................... 349/106 |
| 2012/0184060 | A1* | 7/2012 | Song et al. | ....................... 438/34 |

FOREIGN PATENT DOCUMENTS

| CN | 1702530 A | 11/2005 |
| CN | 1956172 A | 5/2007 |
| CN | 101656271 A | 2/2010 |

* cited by examiner

*Primary Examiner* — Dao H Nguyen
(74) *Attorney, Agent, or Firm* — Ladas & Parry LLP

(57) ABSTRACT

The present invention provides an array substrate, comprising: a base substrate; a pixel electrode pattern and a gate pattern formed on the base substrate, the gate pattern comprises a gate scanning line and a gate electrode of a transistor, both of the gate scanning line and the gate electrode comprise transparent conductive metal layer and the gate metal layer stacking on the substrate, each pixel electrode in the pixel electrode pattern comprises transparent conductive metal layer; a gate insulating layer on the pixel electrode pattern and the gate pattern, an active layer pattern on the gate insulating layer and corresponding to the gate electrode, a via hole in the gate insulating layer for exposing the pixel electrode; and a source/drain pattern on the gate insulating layer, the source/drain pattern comprises a data scanning line crossing with the gate scanning line, source and drain electrodes of the transistor, and the drain electrode is in contact with the pixel electrode through the via hole.

6 Claims, 5 Drawing Sheets

ARRAY SUBSTRATE AND METHOD FOR MANUFACTURING THE SAME

BACKGROUND

Embodiments of the present invention relate to an array substrate of a thin film transistor-liquid crystal display (TFT-LCD) and a method of manufacturing the same.

A TFT-LCD has the advantages of light weight, thin profile, and low radiation. A TFT-LCD comprises an array substrate, a color filter substrate, liquid crystal, and a backlight source. In general, a TFT-LCD array substrate mainly comprises a base substrate, gate electrodes, a gate insulating layer, a semiconductor layer, a semiconductor protecting layer, and pixel electrodes, etc. The TFT-LCD array substrate is commonly manufactured by a set of thin film deposition processes and photolithography processes, and one photolithography process typically corresponds to one pattern layer. Currently, with the rapid development of the manufacturing technology of the liquid crystal display, the photolithography process for a TFT-LCD array substrate now has developed from the original seven photolithography technology to four-photolithography technology. Ordinarily, the fewer times the photolithography process is employed in the manufacturing process, the higher the producing efficiency will be, and the lower the manufacturing cost will be.

SUMMARY

One embodiment provides a method for forming an array substrate, the method comprising: 1) sequentially depositing a transparent conductive metal layer and a gate metal layer on a base substrate; 2) performing a patterning process by using a first dual-tone mask plate to form a pixel electrode pattern and a gate pattern comprising a gate electrode and a gate scanning line; 3) sequentially depositing a gate insulating layer and an active layer on the base substrate with the formed pixel electrode pattern and the gate pattern; 4) performing a patterning process by using a second dual-tone mask plate to form an active pattern corresponding to the gate electrode and a via hole in the gate insulating layer for exposing the pixel electrode, and remaining photoresist the active layer pattern; 5) depositing a source/drain metal layer on the base substrate with the active pattern and the via hole, through which the source/drain metal layer is in contact with the pixel electrode; 6) lifting off the photoresist remaining on the active layer pattern to remove the photoresist and a portion of the source/drain metal layer corresponding to the photoresist; and 7) performing a patterning process by using a third mask plate to forming a source/drain pattern, wherein the source/drain pattern comprises a data scanning line crossing with the gate scanning line, a source electrode and a drain electrode, and a portion of the drain electrode is in contact with the pixel electrode through the via hole.

Another embodiment provides an array substrate, comprising: a base substrate; a pixel electrode pattern and a gate pattern formed on the base substrate, wherein the gate pattern comprises a gate scanning line and a gate electrode of a thin film transistor (TFT), both of the gate scanning line and the gate electrode comprise a transparent conductive metal layer and a gate metal layer that are stacked in order on the base substrate, and each pixel electrode in the pixel electrode pattern comprises the transparent conductive metal layer; a gate insulating layer on the pixel electrode pattern and the gate pattern, an active layer pattern on the gate insulating layer and corresponding to the gate electrode, a via hole in the gate insulating layer for exposing the pixel electrode; and a source/drain pattern on the gate insulating layer, wherein the source/drain pattern comprises a data scanning line crossing with the gate scanning line, source and drain electrodes of the TFT, and the drain electrode is in contact with the pixel electrode through the via hole.

BRIEF DESCRIPTION OF THE DRAWINGS

For more clearly illustrating the technical solution in the present embodiment or the prior art, the accompanying drawings used in describing the embodiments or the prior art will be simply described. It is apparent that the accompanying drawings only shows some embodiments of the present invention, and those skilled in the art can obtain other drawings based on these given drawings without any inventive labor, wherein.

DETAILED DESCRIPTION

The invention now will be described more clearly and fully hereinafter with reference to the accompanying drawings, in which the embodiments of the invention are shown. Apparently, the embodiments described below are merely a portion of but not all of the embodiments of the invention. All of other embodiments made by those skilled in the art on the basis of the described embodiments without mental work fall within the scope of the present invention. Also, the embodiments described hereinafter are alternative solutions. The embodiment number and the sequence of the embodiments have nothing to do with the preferable performing sequence thereof.

Figure 1:
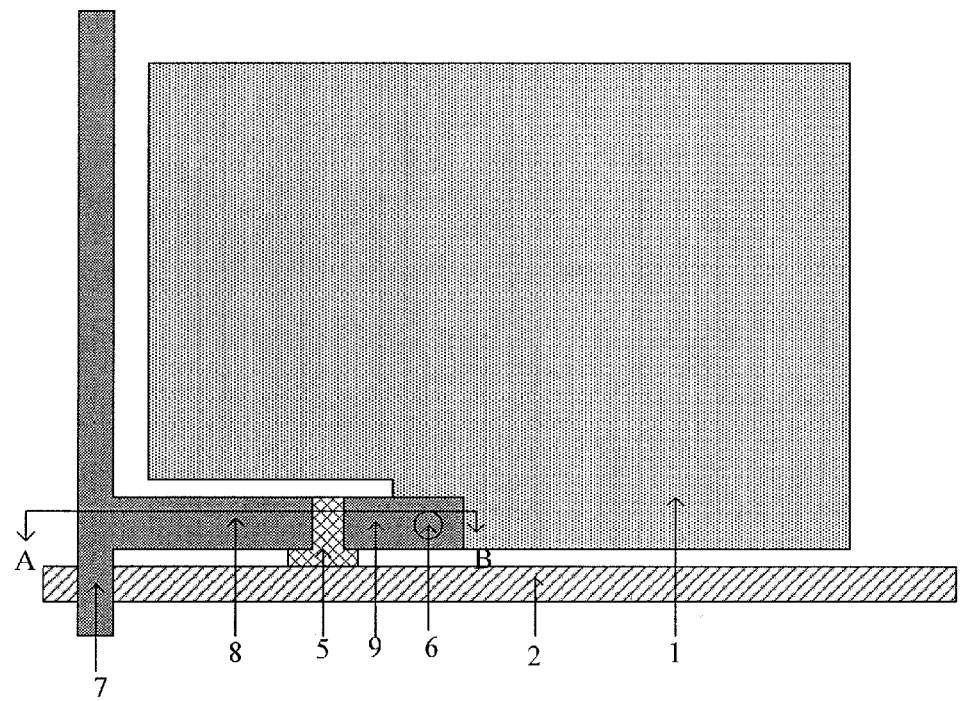
FIG. 1 is a schematic plan view of an array substrate in an embodiment of the present invention.
Figure 2:
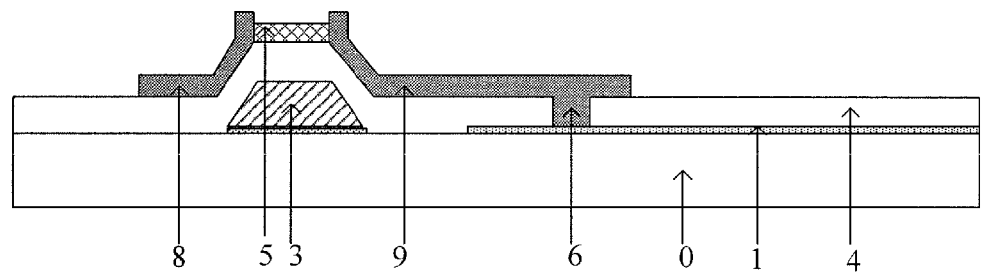
FIG. 2 is a schematic cross-section view of the array substrate according to the embodiment of the present invention.

An embodiment of the present invention provides a structure of an array substrate, which is formed on a base substrate 0, as shown in FIGS. 1 and 2. FIG. 1 is a plan view of the array substrate, FIG. 2 is a cross-section view taken along line A-B as shown in FIG. 1. A circuit pattern formed on the base substrate 0 comprises a pixel electrode pattern and a gate pattern comprising a gate scanning line 2 and a gate electrode 3 of a thin film transistor, and the gate scanning line 2 and the gate electrode 3 are formed with a transparent conductive metal layer and a gate metal layer that are sequentially formed on the substrate 0. Each pixel electrode 1 of the pixel electrode pattern is formed with a transparent conductive metal layer.

A gate insulating layer 4 is deposited on the pixel electrode pattern and the gate pattern. An active layer pattern 5 is formed in an island shape on the gate insulating layer 4 corresponding to the gate electrode 3, and a via hole 6 is formed in the gate insulating layer 4 to expose the underlying pixel electrode 1.

A source/drain pattern is further formed on the gate insulating layer 4, and comprises a data scanning line 6 crossing with the gate scanning line 3 and a source electrode 8 and a drain electrode 9 of the thin film transistor. The source electrode 8 and drain electrode 9 contact with the active layer pattern 5, and the drain electrode 9 is in connection with the pixel electrode 1 through the via hole 6.

In the array substrate provided in the present embodiment, the pixel electrode is directly formed on the base substrate. The array substrate can be employed as the TFT-LCD array substrate of a liquid crystal display, and can be fabricated by a three-photolithography process. Compared with a four-photolithography process, the three-photolithography process of the embodiment uses fewer manufacture devices, such as mask plates or the like used in the manufacturing process, reduces production period, and increases production efficiency.

Correspondingly, the embodiment of the present invention further provides a method for manufacturing the above-described array substrate, which mainly comprises the following steps.

Step 1, sequentially depositing a transparent conductive metal layer and a gate metal layer on a base substrate;

Step 2, performing a first photolithography process, comprising: performing a patterning process with a first dual-tone mask plate to form a pixel electrode pattern and a gate pattern, wherein a pixel electrode of the pixel electrode pattern comprises a transparent conductive metal layer, both of a gate electrode of a thin film transistor (TFT) and a gate scanning line of the gate pattern comprise the transparent conductive metal layer and the gate metal layer that are stacked together;

Step 3, sequentially depositing a gate insulating layer and an active layer on the substrate on which the pixel electrode pattern and the gate pattern have already been formed;

Step 4, performing a second photolithography process, comprising: performing a patterning process with a second dual-tone mask plate to form a via hole that penetrates through the gate insulating layer and exposes the pixel electrode, and to form an active layer pattern corresponding to the gate electrode, i.e., the active layer pattern being disposed over the gate electrode, and remaining photoresist on the active layer pattern;

Step 5, depositing a source/drain metal layer on the base substrate on which the active layer pattern and the via hole have already been formed, wherein the source/drain metal layer comes in contact with the pixel electrode through the via hole;

Step 6, lifting off the photoresist left on the active layer pattern and the source/drain metal layer covering the photoresist, to form a channel of the TFT;

Step 7, performing a third photolithography progress, comprising: performing a patterning process with a third mask plate to form source/drain pattern, wherein the source/drain pattern comprises a date scanning line crossing with the gate scanning line, a source electrode and a drain electrode of the TFT, and the drain electrode of the source/drain pattern comes in contact with the pixel electrode through the via hole.

According to the method provided in the present embodiment, the manufacture of the array substrate can be completed by three photolithography processes corresponding to three patterning progresses.

First Embodiment

Figure 3:
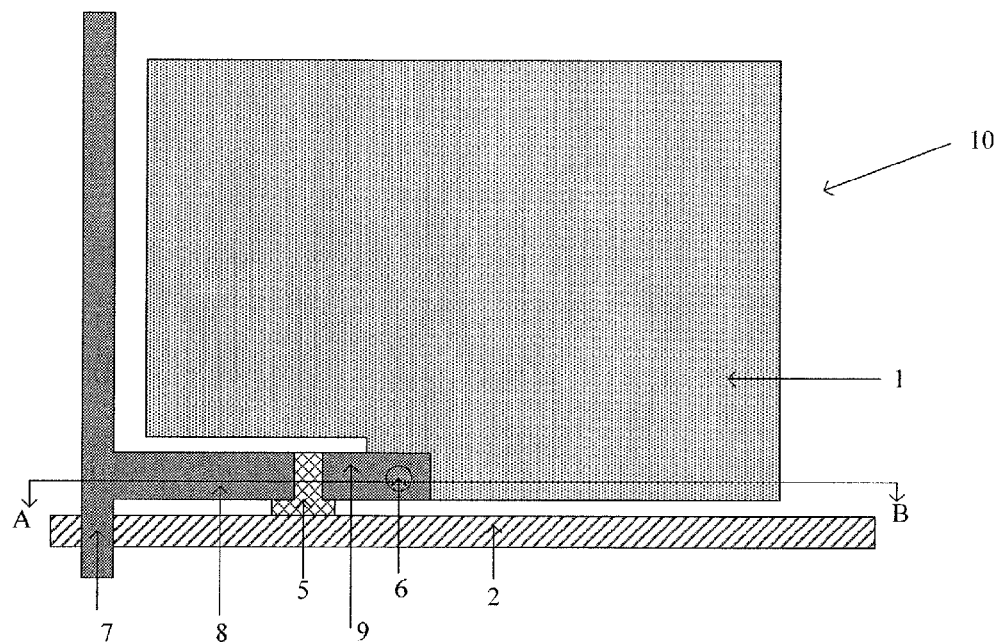
FIG. 3 is a schematic plan view of an array substrate according to embodiment 1 of the present invention.
Figure 4:
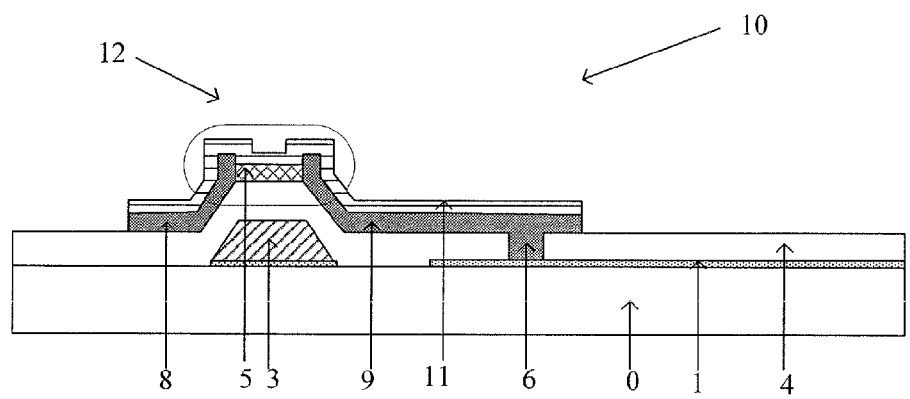
FIG. 4 is a schematic cross-section view of the array substrate according to the embodiment 1 of the present invention.

The present embodiment provides a TFT-LCD array substrate 10 with reference to FIGS. 3 and 4. FIG. 3 is a plan view of an array substrate 10, FIG. 4 is a cross-section view of the substrate 10 in FIG. 3 taken along line A-B. The TFT-LCD array substrate 10 is formed on a transparent base substrate 1 (e.g., a glass or plastic substrate), and comprises a pixel electrode pattern and a gate pattern. The gate pattern comprises a gate scanning line 2 and a gate electrode 3 of a thin film transistor (TFT), the gate scanning line 2 and the gate electrode 3 are formed of a transparent conductive metal layer (with thickness of 300~600 Å) and a gate metal layer (with thickness of 3000~5000 Å) which are sequentially deposited on the substrate 0. Each pixel electrode 1 in the pixel electrode pattern is formed with the transparent conductive metal layer.

A gate insulating layer 4 is deposited on the gate electrode pattern and the gate pattern. An active layer pattern 5, which is used for forming a channel of the TFT and is in contact with a source electrode and a drain electrode of the TFT, is formed in an island shape on the gate insulating layer 4 corresponding to the gate electrode 3, and a via hole 6 is formed in the gate insulating layer 4 to expose a portion of the pixel electrode 1.

A source/drain pattern is further formed on the gate insulating layer 4, and comprises a data scanning line 7 crossing with the gate scanning line 2, and a source electrode 8 and a drain electrode 9 of the thin film transistor. All of the data scanning line 7 crossing with the gate scanning line 2 and the source and drain electrodes 8 and 9 in the source/drain pattern are formed with a source/drain metal layer. A part of the source/drain metal layer forming the drain electrode 9 is deposited in the via hole 6 so as to be electrically connected with the pixel electrode 1.

As shown in FIG. 3, the source and drain electrodes 8 and 9 of the thin film transistor have defined a TFT channel 12 of the TFT-LCD array substrate 0 together with the active layer pattern 5.

In addition, in order to better protect the source/drain pattern and the source layer pattern 5 formed on the substrate 0, a passivation pattern formed from a deposited passivation layer 11 is further provided on the source/drain pattern and the active layer pattern 5. Since the passivation layer 11 is used for protecting the data scanning line 7, the source electrode 8, and the drain electrode 9, the passivation pattern is disposed on the data scanning line 7, the source electrode 8 and the drain electrode 9, and the active layer pattern 5. As shown in FIG. 4, the passivation layer 11 of the present embodiment may not be disposed on the entire substrate 0 smoothly, and is etched to form the passivation pattern covering the data scanning line 7, the source and drain electrodes 8 and 9, and the active layer pattern 5. As such, those skilled in the art can design a third mask plate to expose the source/drain metal layer at the edge of the array substrate, so that the array substrate to be formed can be easily connected with an exterior control circuit.

The transparent pixel electrode layer may be formed of any material selected from Indium Tin Oxides (ITO), Indium Zinc Oxide (IZO), or other transparent metal oxide. The gate metal layer may be formed at least one metal layer selected from a group consisting of Cr, W, Ti, Ta, Mo, and any alloy thereof. The active layer may be made of oxide semiconductor, such as a-IGZO (amorphous In—Ga—Zn—O) or the like. The difference in the work function between the oxide semiconductor and the source/drain metal layer is small, so the contact resistance between the oxide semiconductor and the source/drain metal layer is small. When amorphous silicon is used for the semiconductor layer, since the difference in the work function between amorphous silicon and the source/drain metal layer is big, which causes a big contact resistance between the amorphous silicon and the source/drain metal layer, and an ohmic contact layer is further needed. In the case of using the oxide semiconductor, the ohmic contact layer used for reducing the contact resistance between the semiconductor layer and the source/drain metal layer become unnecessary. The described source/drain metal layer may be made of any one or any alloy of Cr, W, Ti, Ta, Mo, etc., and may be in a single layer or multi-layer structure. The passivation layer may comprise oxide, nitride, or nitrogen oxide, etc.

The TFT-LCD array substrate of the present embodiment can be formed by a three-photolithography process, so the production cost of the TFT-LCD array substrate can be reduced, and the production efficiency can be improved.

Second Embodiment

Figure 6:
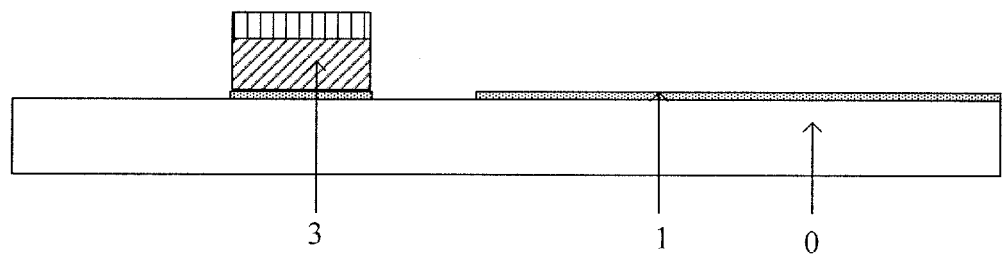
FIG. 6 is a schematic view of the array substrate after second etching process according to the embodiment 2 of the present invention.

The present embodiment provides a method for manufacturing the TFT-LCD array substrate 10 of the first embodiment. The method can be implemented by three photolithography processes, as shown in FIG. 6, and comprises the following steps.

Hereinafter, a first photolithography process will be described.

Step 201, sequentially depositing a transparent conductive metal layer and a gate metal layer on a base substrate 0 by a sputtering or thermal evaporating method. The thickness of the transparent conductive metal layer is in the range of 300~600 Å, and the thickness of the gate metal layer is in the range of 3000~5000 Å.

The transparent pixel electrode layer may be made of ITO or IZO. The gate metal layer comprises at least one metal layer that may be any one or any alloy of Cr, W, Ti, Ta, and Mo.

Step 202, performing a patterning process with a first dual-tone mask plate to form a pixel electrode pattern and a gate pattern, wherein a pixel electrode 1 of the pixel electrode pattern comprises a transparent conductive metal layer, a gate electrode 3 and a gate scanning line 2 in the gate pattern each comprise the stacked transparent conductive metal layer and gate metal layer.

The first dual-tone mask plate of the present embodiment may be a first half-tone mask plate or a gray-tone mask plate.

In detail, the patterning process in the step 202 comprises: coating a photoresist layer, and performing an exposing process with the first dual-tone mask plate, so that the region of the base substrate 0 corresponding to the pixel electrode pattern is changed to a partial-exposure region, the region of the base substrate 0 corresponding to the gate pattern is a non-exposure region, and the remaining region is a full-exposure region. The gate pattern comprises the gate electrode 3 and the gate scanning line 2. After developing, the photoresist layer in the full-exposure region is removed, and the photoresist in the partial-exposure region is thinner than that in the non-exposure region.

Figure 5:
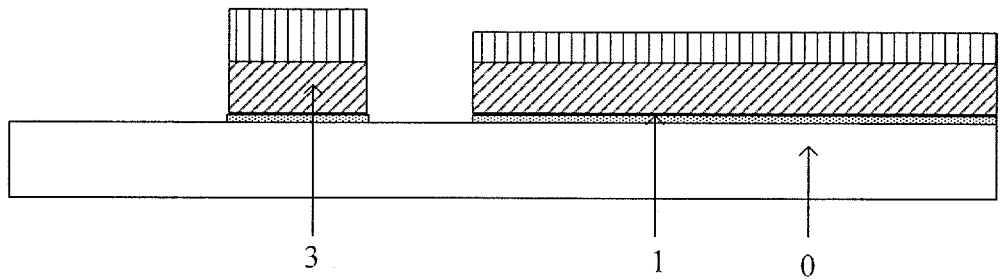
FIG. 5 is a schematic view of the array substrate after first etching process according to the embodiment 2 of the present invention.

The transparent conductive metal layer and the gate metal layer in the full-exposure region are etched in an etching process, and the resultant structure is shown in FIG. 5.

Figure 7:
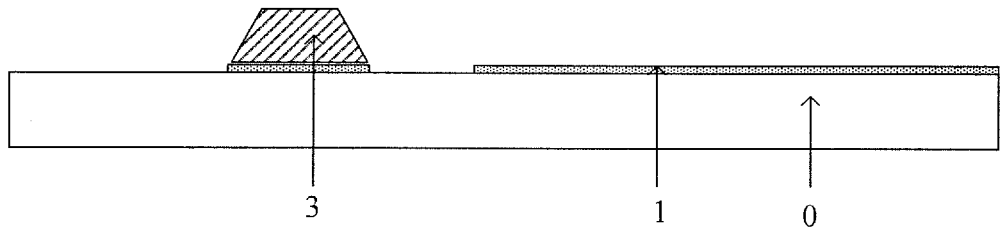
FIG. 7 is a schematic view of a gate pattern formed by removing photoresist from the array substrate according to the embodiment 2 of the present invention.

The photoresist in the partial-exposure region is removed in an ashing process. The gate metal layer thus exposed in the partial-exposure region then is etched in another etching process to expose the pixel electrode pattern, as shown in FIG. 6, The remaining photoresist in the non-exposure region is removed to expose the gate pattern, and the gate electrode and the gate scanning line of the gate pattern comprises the stacked transparent conductive metal layer and gate metal layer, as shown in FIG. 7. With reference to FIG. 7, the gate metal layer is etched in the above process to form the gate electrode 3 and the gate scanning line 2 of the gate pattern (not shown in FIG. 7), and the transparent conductive metal layer is etched in the above process to form the pixel electrode 1 of the pixel electrode pattern.

Hereinafter, a second photolithography process will be described.

Step 203, sequentially depositing a gate insulating layer and an active layer on the base substrate 0, on which the pixel electrode pattern and the gate pattern has already been formed.

Figure 8:
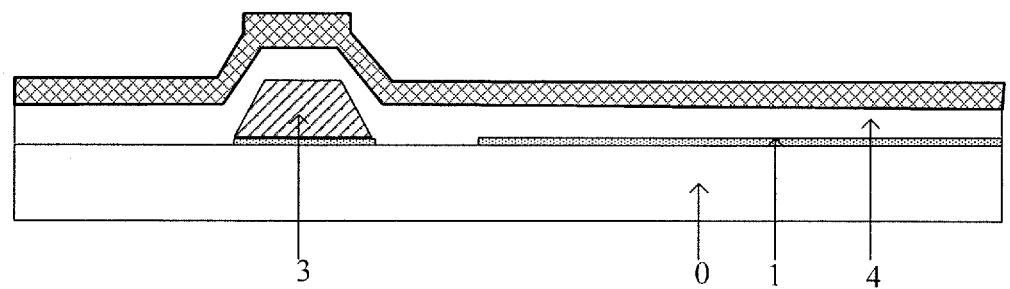
FIG. 8 is a schematic view of the array substrate after depositing a gate insulating layer and an active layer thereon according to the embodiment 2 of the present invention.

In detail, depositing the gate insulating layer on the entire substrate 0 formed with the pixel electrode pattern and the gate pattern by a plasma enhanced chemical vapor deposition (PECVD) method, the thickness of the gate insulating layer is in the range of 300~1000 Å; then, depositing the active layer on the gate insulating layer by a sputtering or thermal evaporation method, the thickness of the active layer is in the range of 1000~4000 Å, as shown in FIG. 8. The material of the gate insulating layer may be oxide, nitride, or nitrogen oxide, and the corresponding reaction gas may be $SiH_4$, $NH_3$, and $N_2$ or $SiH_2Cl_2$, $NH_3$, and $N_2$; the material of the active layer may be a-IGZO or other oxide semiconductor layer. The carrier mobility of the oxide semiconductor is high, and the difference in work function between the oxide semiconductor and the source/drain metal layer is small, so the contact resistance therebetween is small. Thus, the ohmic contact layer used for reducing the contact resistance between the active layer and the source/drain metal layer is unnecessary, and they can directly contact each other.

Step 204, performing a patterning process with a second dual-tone mask plate to form a gate insulating via hole 6 exposing the underlying pixel electrode and an active layer pattern 5 corresponding to the gate electrode 3, and keeping the photoresist on the active layer pattern 5.

The second dual-tone mask plate may be a second half-tone mask plate or a gray-tone mask plate.

In detail, the patterning process in the step 204 comprises: coating a photoresist layer, and performing an exposing process with the second dual-tone mask plate, so that the region of the base substrate 0 corresponding to the via hole 6 is changed to a full-exposure region, the region of the base substrate 0 corresponding to the active layer pattern 5 is a non-exposure region, and the remaining region is a partial-exposure region. After developing, the photoresist layer in the full-exposure region is removed, and the photoresist layer in the partial-exposure region is thinner than that in the non-exposure region.

Figure 9:
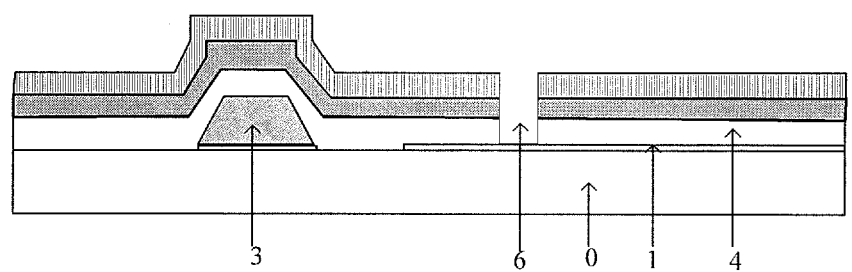
FIG. 9 is a schematic view of the array substrate after third etching process according to the embodiment 2 of the present invention.

The active layer and the gate insulating layer located in the full-exposure region are etched in an etching process so as to form the via hole 6. The via hole 6 penetrates through the gate insulating layer and exposes the pixel electrode 1, as shown in FIG. 9.

Figure 10:
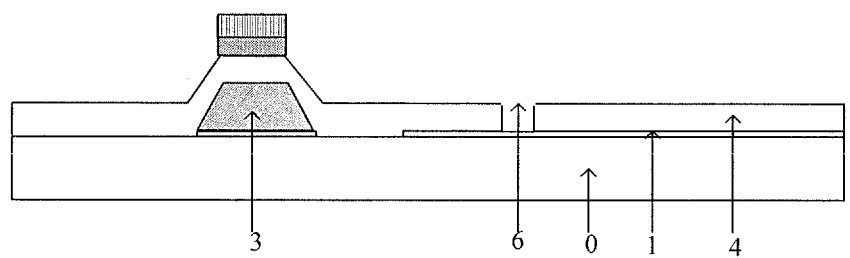
FIG. 10 is a schematic view of the array substrate after fourth etching process according to the embodiment 2 of the present invention.

The photoresist in the partial-exposure region is removed in an ashing process. The active layer thus exposed in the partial-exposure region is then etched in another etching process to form the active layer pattern 5 overlapping with the gate electrode 3, and the photoresist on the active pattern 5 is remained, as shown in FIG. 10.

Figure 11:
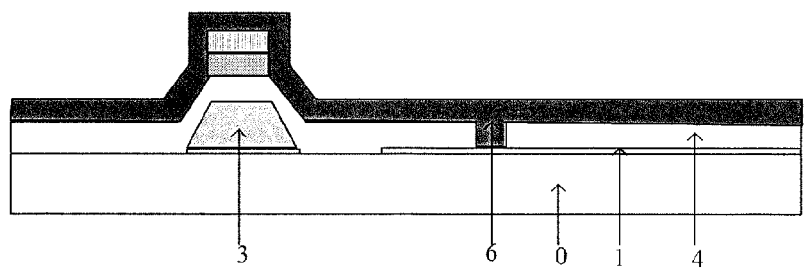
FIG. 11 is a schematic view of the array substrate after depositing a source/drain metal layer thereon according to the embodiment 2 of the present invention.

Step 205, depositing the source/drain metal layer with a thickness of 2000~4000 Å on the base substrate formed with the active layer pattern 5 and the via hole 6 by a sputtering or thermal evaporation method. The source/drain metal layer may be formed of any one or any alloy of Cr, W, Ti, Ta, and Mo in a single layer or multi-layer structure. The source/drain metal layer is in contact with the pixel electrode through the via hole 6, as shown in FIG. 11.

Step 206, lifting off the photoresist remaining on the active pattern 5. In this lifting-off process, both the photoresist on the active pattern 5 and the source/drain metal layer covering the photoresist are removed.

Figure 12:
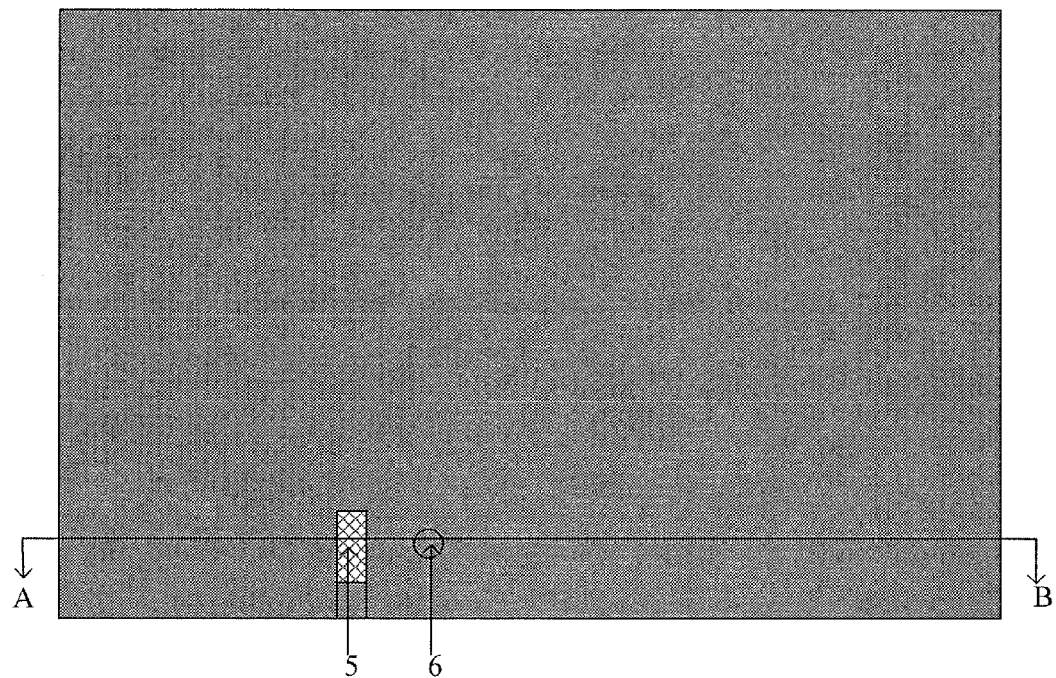
FIG. 12 is a schematic view showing a TFT channel formed in the array substrate according to the embodiment 2 of the present invention.
Figure 12:
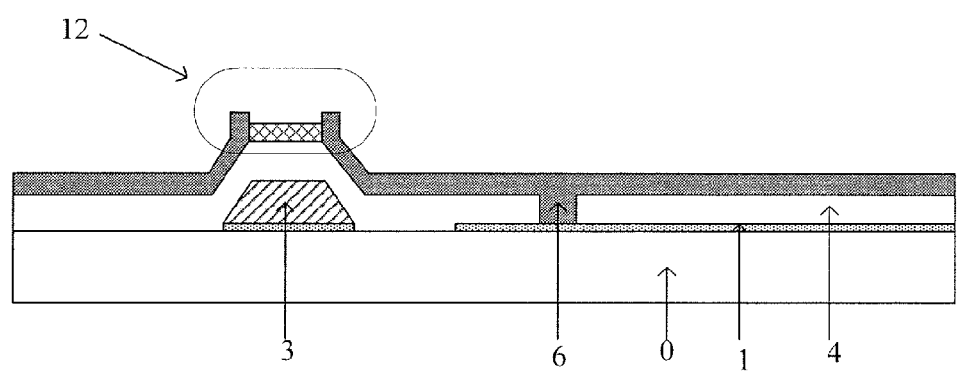

The step 206 can be implemented in the following way. Since the metal layer for forming the data line is not transparent, the substrate 0 in FIG. 11 can be heated or baked. The structure of the photoresist below the source/drain metal layer is changed after the photoresist is heated, and thus slits can be generated in the left photoresist layer and the source/drain metal layer located on the photoresist. Thus, the photoresist lifting-off solution can penetrate and react with the photoresist through the slits, so that the photoresist can be removed together with a portion of the source/drain metal layer that is in contact with the lifting-off solution. A TFT channel 12 is formed, as shown in FIG. 12.

Hereinafter, a third photolithography process will be described.

Step 207, depositing a passivation layer 11 having a thickness of 700~4000 Å on the base substrate 0, on which the photoresist above the active layer pattern 5 and the portion of the source/drain metal layer corresponding to the photoresist have been lifted-off, by a plasma enhanced chemical vapor deposition (PECVD) method. The passivation layer 11 may be made of oxide, nitride, or nitrogen oxide, and the corresponding reaction gas may be $SiH_4$, $NH_3$, and $N_2$ or $SiH_2Cl_2$, $NH_3$, and $N_2$, etc. Then, the base substrate on which the passivation layer 11 has been deposited undergoes patterning to form the source/drain pattern by using a third mask plate, as shown in FIG. 3, and FIG. 4 which is a cross-section view of the substrate 0 in FIG. 3 taken along line A-B. The source/drain pattern comprises the data scanning line 7, the source electrode 8, and the drain electrode 9, and the drain electrode 9 comprises a portion of the source/drain metal layer in contact with the pixel electrode 1 through the via hole 6. While forming the source/drain pattern in the patterning process, the passivation pattern corresponding to the source/drain pattern and the active layer pattern 5 is formed. Since the passivation layer 11 is used for protecting the source/drain pattern and the active layer pattern, the passivation pattern is in the same profile as the source/drain pattern and the active layer pattern 5, as shown in FIG. 4. With reference to FIG. 4, the source/drain metal layer is etched to form the source electrode 8, the drain electrode 9, and data scanning line 7 by the above process.

The present embodiment provides a method for manufacturing the TFT-LCD array substrate by a three-photolithography process. Compared with four-photolithography process, the embodiment reduces the steps in the producing process, decreases the cost of the manufacture device, such as mask plate, and thus improves the production efficiency.

The above embodiments are described only for the purpose of illustrating the present invention, but not a limitation thereto. Those skilled in the art can easily obtain various modifications and alternations that fall within the scope of the present invention. Therefore, the scope of the present invention is defined by the scope of the claims.

What is claimed is:

1. A method for forming an array substrate comprising:
   1) sequentially depositing a transparent conductive metal layer and a gate metal layer on a base substrate;
   2) performing a patterning process by using a first dual-tone mask plate to form a pixel electrode pattern and a gate pattern comprising a gate electrode and a gate scanning line;
   3) sequentially depositing a gate insulating layer and an active layer on the base substrate with the formed pixel electrode pattern and the gate pattern;
   4) performing a patterning process by using a second dual-tone mask plate to form an active pattern corresponding to the gate electrode and a via hole in the gate insulating layer for exposing the pixel electrode, and remaining photoresist the active layer pattern;
   5) depositing a source/drain metal layer on the base substrate with the active pattern and the via hole, through which the source/drain metal layer is in contact with the pixel electrode;
   6) lifting off the photoresist remaining on the active layer pattern to remove the photoresist and a portion of the source/drain metal layer corresponding to the photoresist; and
   7) performing a patterning process by using a third mask plate to forming a source/drain pattern, wherein the source/drain pattern comprises a data scanning line crossing with the gate scanning line, a source electrode and a drain electrode, and a portion of the drain electrode is in contact with the pixel electrode through the via hole.

2. The method of claim 1, wherein the step 2) comprises the following steps in sequence:
   performing an exposing process by using the first dual-tone mask plate, so that a portion of the base substrate corresponding to the pixel electrode pattern is a partial-exposure region, a portion corresponding to the gate pattern is a non-exposure region, and the remaining portion is in a full-exposure region;
   etching the transparent conductive metal layer and the gate metal layer in the full-exposure region by an etching process;
   removing photoresist in the partial-exposure region by an ashing process, and etching thus exposed gate metal layer in the partial-exposure region by another etching process to expose the pixel electrode pattern, wherein a pixel electrode in the pixel electrode pattern comprises the transparent conductive metal layer; and
   removing the photoresist in the non-exposure region to form the gate pattern, wherein both of the gate electrode and the gate scanning line in the gate pattern comprises the staked transparent conductive metal layer and gate metal layer.

3. The method of claim 1, wherein the step 4) comprises the following steps in sequence:
   performing an exposing process by using the second dual-tone mask plate, so that a portion of the base substrate corresponding to the via hole is a full-exposure region, a portion corresponding to the active layer pattern is a non-exposure region, and the remaining portion is in a partial-exposure region;
   etching the active layer and the gate insulating layer in the full-exposure region by an etching process, wherein the via hole penetrates through the gate insulating layer and exposes the underlying pixel electrode; and removing photoresist in the partial-exposure region by an ashing process, and etching thus exposed active layer in the partial-exposure region by the etching process to form the active pattern corresponding to the gate electrode, wherein photoresist is remained on the active layer pattern.

4. The method of claim 1, wherein the step 7) comprises the following steps in sequence:

depositing a passivation layer on the base substrate, on which photoresist over the active layer pattern and the portion of the source/drain metal layer corresponding to the photoresist have been lifted off;

performing a patterning process by using the third mask plate to form the source/drain pattern and a passivation pattern, wherein the passivation pattern corresponds to the source/drain pattern and the active pattern.

5. The method of claim 1, wherein the active layer comprises an oxide semiconductor.

6. The method of claim 5, wherein the oxide semiconductor comprises amorphous indium gallium zinc oxide.

* * * * *